United States Patent [19]
Karpinski

[11] Patent Number: 5,394,021
[45] Date of Patent: Feb. 28, 1995

[54] PIEZOELECTRIC TRANSDUCER DRIVE

[76] Inventor: Andrew J. Karpinski, 1715 Manchester Dr., Clearwater, Fla. 34616

[21] Appl. No.: 993,149

[22] Filed: Dec. 18, 1992

[51] Int. Cl.⁶ .................. H03K 17/56; H03K 5/12
[52] U.S. Cl. .................... 327/108; 327/114; 327/172; 327/291; 327/306
[58] Field of Search .............. 307/246, 264–265, 307/270–271; 328/59, 63

[56] References Cited

U.S. PATENT DOCUMENTS

| | | | |
|---|---|---|---|
| 4,024,480 | 5/1977 | Reeder et al. | 333/70 T |
| 4,070,638 | 1/1978 | Reeder | 333/30 R |
| 4,277,978 | 7/1981 | Puckette | 73/632 |
| 4,752,750 | 6/1988 | Zimmerman et al. | 333/166 |
| 4,915,492 | 4/1990 | Toth | 350/632 |

FOREIGN PATENT DOCUMENTS 3065068  3/1991  Japan .

Primary Examiner—Margaret Rose Wambach

[57] ABSTRACT

Piezoelectric transducer drive apparatus applies varying pulse rates to the terminals of the transducer with the transducer acting as a capacitor and integrating the applied pulses. A conductive path from each transducer terminal remover charge from each terminal. Control of the voltage across the transducer is achieved by individually varying the pulse rates applied to each of the transducer terminals.

18 Claims, 4 Drawing Sheets

PIEZOELECTRIC TRANSDUCER DRIVE

BACKGROUND OF THE INVENTION

This application is related to an application entitled Piezoelectric Transducer Drive having the same inventor, the same assignee and the same filing date as the present application.

The present invention relates to the control of the voltage applied to a piezoelectric transducer. The present invention is described in terms of a specific application to path length control in a ring laser gyroscope, however, there are many applications of the present invention that are unrelated to ring laser gyroscopes.

Ring laser angular rate sensors sometimes referred to as ring laser gyros or RLGS are well known in the art. RLGS include a ring laser supported in a block having a plurality of gas containing tunnels. At the intersection of the tunnels are mirrors to define a closed loop optical path which is traveled by the counter propagating laser beams. RLGS typically include a path length controller which has the purpose of maintaining a path length which is equal to an integral number of wavelengths. The path length controller function is usually provided by one of the mirrors being attached to a piezoelectric transducer which controls translational movement of the mirror to affect the laser beam path length. One technique for maintaining path length is detecting the intensity of the laser beams, for example by using a photodiode, and controlling the path length of the RLG such that the intensity as measured by the photodiode is at a maximum.

Various approaches to the electronics for path length control have been utilized. These approaches have ranged from the use of analog signals only for path length control to various Processor in the loop (PITL) path length control approaches. PITL approaches have been proposed for certain PLC signal processing with digital to analog converters and analog amplifiers still used to drive the piezoelectric transducers. The quality of digital to analog converters required for military and certain other applications results in very costly digital to analog devices. Thus a need exists in some PITL applications of RLG path length control to be able to drive the piezoelectric transducer without having to provide the digital to analog converter. Also, there is a need for all digital piezoelectric drive apparatus in applications unrelated to RLGS.

SUMMARY OF THE INVENTION

The present invention solves these and other needs by providing an apparatus for applying a drive voltage to a piezoelectric transducer. A first pulse rate applies a first charge to one terminal of the transducer at a first rate while charge is drained from the terminal at a different rate.

A second pulse rate signal applies a second charge to the other terminal of the transducer at a second rate while charge is drained from the other terminal at a different rate. Control of the first and second charge rates by control of the pulse rates results in control of the voltage across the transducer.

DETAILED DESCRIPTION

Figure 1A:
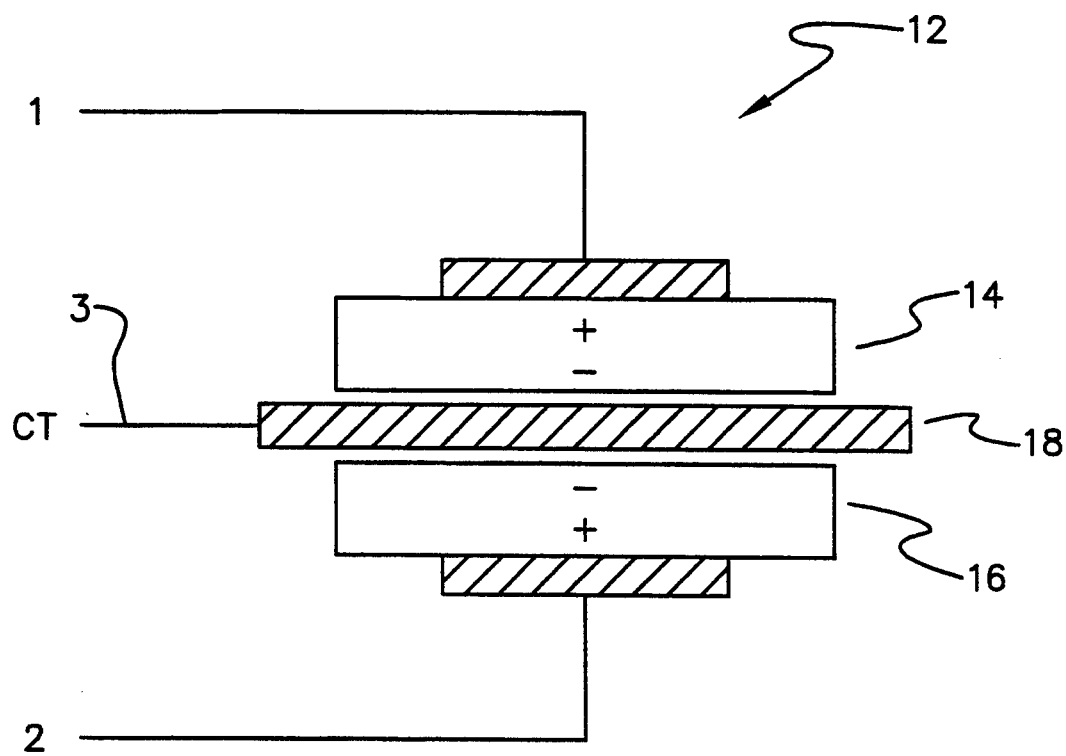
FIGS. 1a through 1c illustrate a piezoelectric transducer and its electrical equivalent.
Figure 1B:
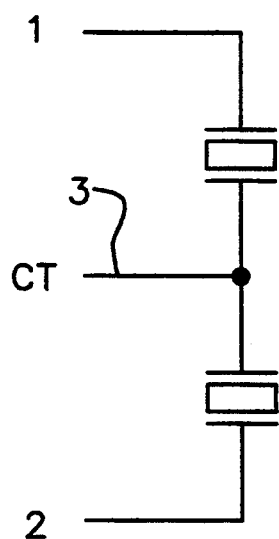
Figure 1C:
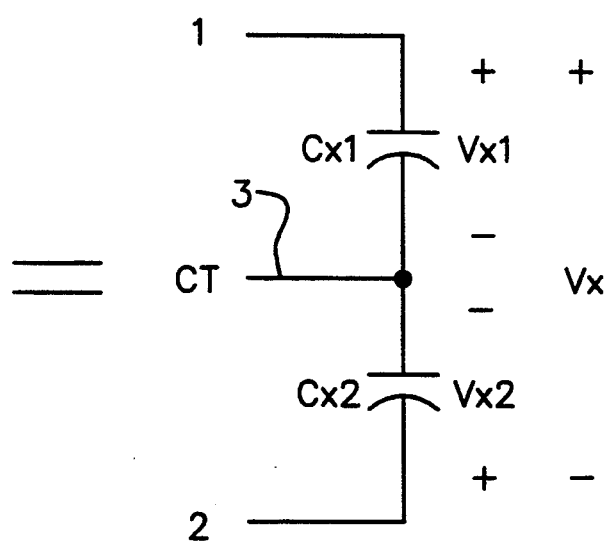

A center tapped piezoelectric transducer 12 is illustrated in FIG. 1a and includes two piezoelectric elements 14 and 16 mounted on either side of a support member 18. Support member 18 is conductive and has an electrical connection 3 which serves as a center tap. Piezoelectric element 14 has an electrical connection 1 and piezoelectric element has an electric connection 2. Center tapped transducer 12 is schematically illustrated in FIG. 1b as two crystals. Transducer 12 can be modeled electrically as two capacitors Cx1 and Cx2 as shown in FIG. 1c and it is possible to deposit charge on one side of capacitor Cx1 at terminal 1. If there is no leakage in transducer 12, then the deposited charge on Cx1 will remain there until something is done to remove it. The voltage across Cx1 will be proportional to the charge deposited, that is capacitor Cx1 will integrate any current pulses applied to it. Similarly charge may be applied to capacitor Cx2 at terminal 2. As illustrated in FIG. 1c, the voltage Vx1 is the voltage across capacitor Cx1 and the voltage Vx2 is the voltage across capacitor Cx2. The voltage across transducer 12 is Vx1 minus Vx2. Therefore it is possible to control the voltage across transducer 12 by varying the rate that current pulses are applied to terminals 1 and 2 of transducer 12 and varying the rate at which the resulting charge is removed from terminals 1 and 2 of transducer 12.

Figure 2:
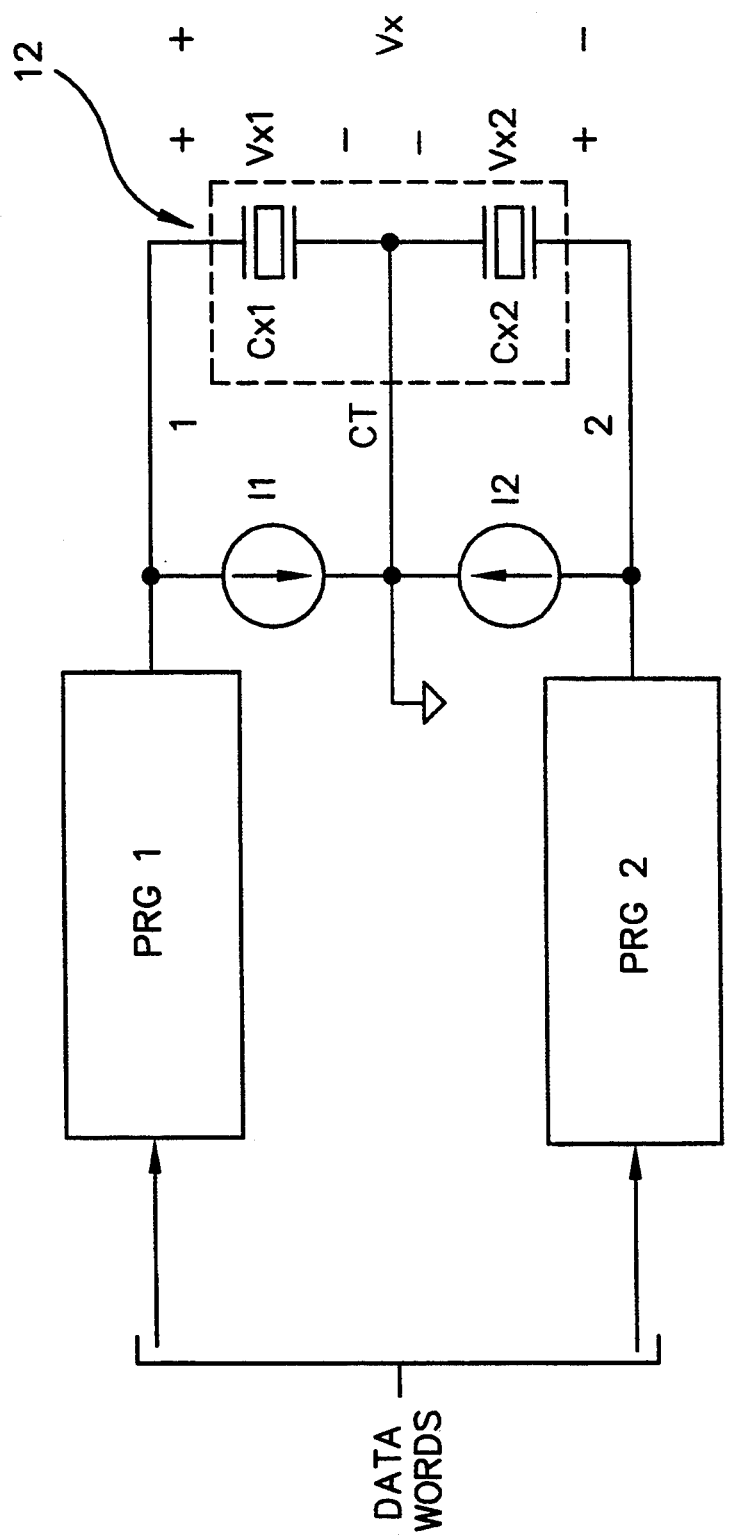
FIG. 2 is a block diagram illustration in accordance with the principles of the present invention.
Figure 3A:
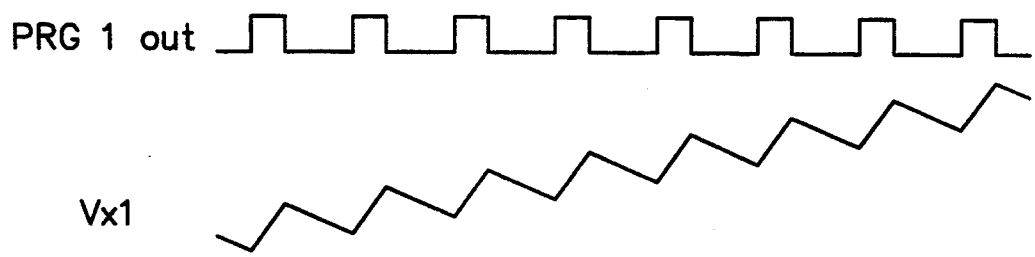
FIGS. 3a through 3c illustrate the operational principles of the block diagram of FIG. 2.

FIG. 2 is a block diagram of an apparatus for controlling the voltage across a piezoelectric transducer in accordance with the present invention. Current sinks I1 and I2 bleed charge off transducer 12 as represented by Cx1 and Cx2 at a known rate. Pulse rate generator PRG1 generates pulses to Cx1 and pulse rate generator PRG2 generates pulses to Cx2. The pulse rate of PRG1 and PRG2 is under the control of a processor which provides a first digital data word to PRG1 and a second digital data word to PRG2. The operation of FIG. 2 can be explained as follows:

1) If, as shown in FIG. 3a, the pulse rate of PRG1 is high enough that the charge deposited on Cx1 is greater than the rate that I1 is removing the charge from Cx1, then Vx1 will, on average increase.

Figure 3B:
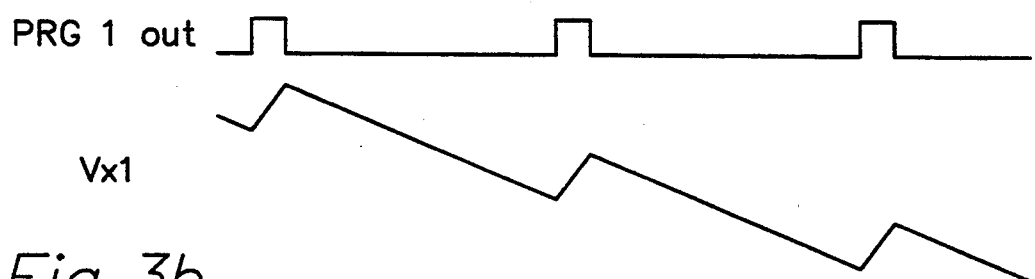

2) If the pulse rate of PRG1 is too low to deposit enough charge on Cx1 to counteract that removed by I1, then Vx1 will on average decrease as illustrated in FIG. 3b.

Figure 3C:
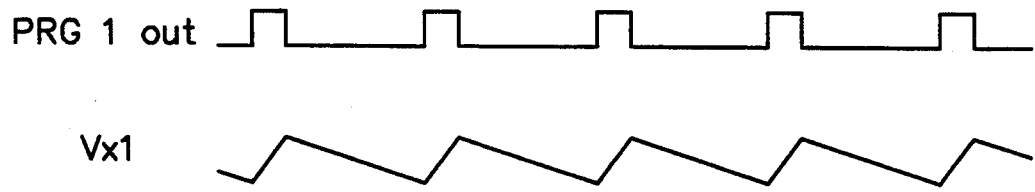

3) If, as shown in FIG. 3c, the pulse rate of PRG1 is high enough to just deposit enough charge on Cx1 to counteract that removed by I1, then the average Vx1 voltage will remain constant.

4) Digital data words would control the rate of PRG2 to control Vx2 in a manner similar to that just described for Vx1.

5) The total voltage across transducer 12, Vx, is Vx1 minus Vx2.

If PRG1, and PRG2 are assumed to be ideal current sources and I1 and I2 are assumed to be ideal current sinks, then there is only one pulse rate or frequency Fc which will keep the average voltage on Vx1 constant, regardless of what the voltage is. Any other pulse rate will cause the Vx1 voltage to either ramp up or down, depending on whether the pulse rate is higher or lower respectively than Fc. This situation exists because there is only one pulse rate for PRG1 that will deposit charge on Cx1 at the same rate that constant current sink I1 removes it from Cx1.

FIG. 4 illustrates in block diagram form, an embodiment of the present invention utilizing a transformer drive. Transformer T1 has a primary 30 and a secondary 32. Transformer T2 has a primary 34 and secondary 36. Primaries 30 and 34 are electrically connected at 38. Secondary 32 is connected through diode 40 to terminal 1' of transducer 12' and center tap 3' is connected to ground. Secondary 36 of transformer T2 is connected through diode 42 to terminal 2' of transducer 12'. Resistor 44 is connected from terminal 1' of transducer 12' to center tap 3' and resistor 46 is connected from terminal 2' of transducer 12' to center tap 3'. Inverting buffer 48 is connected in series with primary 30 and inverting buffer 50 is connected in series with primary 34. Transformers T1 and T2 provide for the translation of voltage levels and provide isolation between the primary and the secondary. During the time that secondary 32 is providing current through diode 40 to terminal 1', terminal 2' is discharging through resistor 46. Diode 42 prevents terminal 2' from discharging through secondary winding 36 during this time. During the time that secondary 36 is providing current through diode 42 to terminal 2' terminal 1' is discharging through resistor 44 and diode 40 is preventing discharge through secondary winding 32.

Figure 4B:
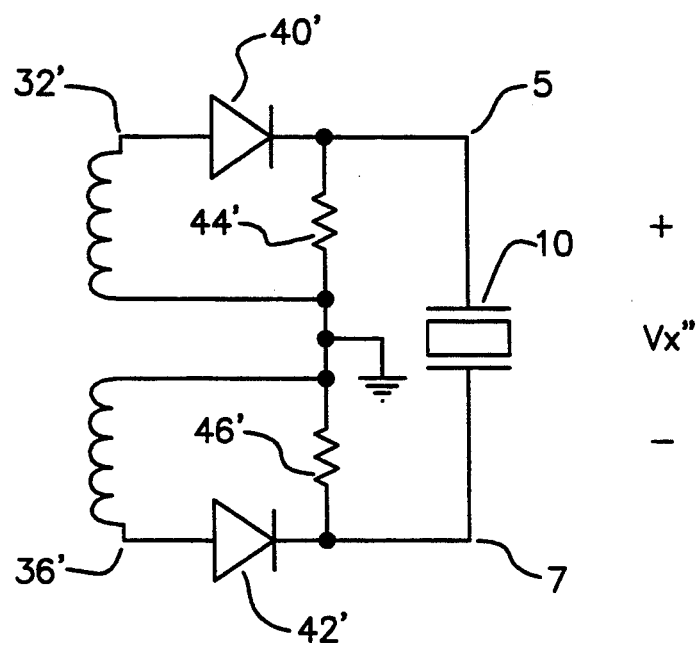
FIG. 4b is a partial block diagram of the use of the present invention with a non-center tap transducer.
Figure 4A:
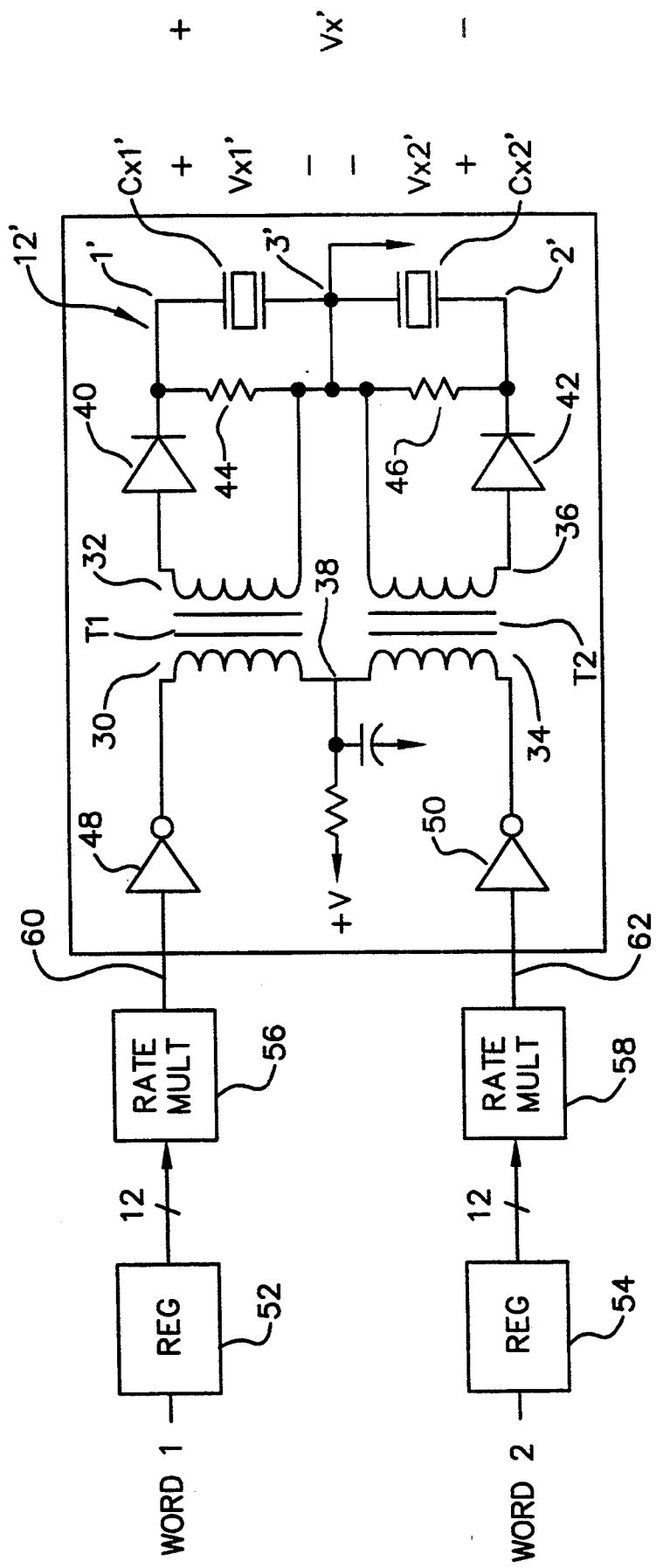
FIG. 4a is a block diagram illustration of a transformer coupled apparatus in accordance with the principles of the present invention.

FIG. 4b illustrates the use of a non-center tap piezoelectric transducer 10 having only terminal 5 and terminal 7. The prime notation (') is used to designate items that are similar to items of FIG. 4a. In FIG. 4b terminal 5 has a discharge path to ground through resistor 44' when terminal 5 is not receiving current pulses from secondary 32'. Terminal 7 has a discharge path to ground through resistor 46' when terminal 7 is not receiving current pulses from secondary 36'.

An application of the present invention for path length control in a ring laser gyroscope can be explained as follows. Laser power in an RLG will typically be monitored by a photodiode, with the photodiode output going to a preamplifier and from the preamplifier to an analog to digital converter (A/D). The output of the A/D would go to a processor and the processor would provide two digital words Word1 and Word2. Word1 would be clocked into register 52 and Word2 would be clocked into register 54. Word1 would then be clocked into rate multiplier 56 and Word2 would be clocked into rate multiplier 58. Output 60 of rate multiplier 56 is the input to inverting buffer 48 and output 62 of rate multiplier 58 is the input to inverting buffer 50. If pulses at 60 and 62 are negative then buffers 48 and 40 would not be inverting type.

Diode 40 isolates the relatively low impedance of secondary 32 of T1 from the voltage on Cx1' when no pulses are output from T1. Diode 42 isolates the secondary 36 of T2 from the voltage on Cx2' when no pulses are output from T2. Resistor 44 functions as current sink I1 of FIG. 2 in that it removes charge from Cx1'. Resistor 46 functions as current sink I2 of FIG. 2 in that it removes charge from Cx2'.

The apparatus of FIG. 4 operates somewhat differently than the ideal arrangement of FIG. 2 that was previously described. For the circuit of FIG. 4 voltage Vx1', for example, has only one corresponding pulse rate that will maintain Vx1' constant. This is because the rate that charge is removed from Vx1' by resistor 44 is a function of voltage Vx1'. This characteristic of the circuit of FIG. 4 means that the software that is directing the signal processing that is determining a new pulse rate to be applied by rate multiplier 56, for example, will have available some knowledge of the value of voltage that exists at Vx1'. This knowledge will be based on the previous pulse rate that was supplied by rate multiplier 56. This differs from the ideal situation of FIG. 3 where the required pulse rate was not related to the voltage on Vx1.

A simulation of the present invention using two capacitors in place of transducer 12 was conducted using a constant input pulse width of 2.5 microseconds. In this simulation it was observed that the voltage across each of the capacitors that simulate transducer 12' increased approximately linearly with the log of the input pulse rate or frequency up to a frequency of approximately 50 KHz. PICO electronics W-26445 transformers connected as step up transformers were used for T1 and T2 in the simulation. Apparently the transformers used limited the maximum pulse rate that provided a linear relationship between the log of the frequency and the voltage across a capacitor.

In the simulation, the rise time for Vx1' upon an increase in pulse rate of PRG1, i.e., output 60, differed from the fall time for a decrease in pulse rate of PRG1. Similar differences were observed for Vx2' and PRG2, i.e., Output 62. In the simulation the value of Cx1' and Cx2' were chosen to be different to more closely simulate a center tap transducer and therefore differences in rise time upon an increase in pulse rate were observed between Cx1' and Cx2'. Fall times upon a decrease in pulse rate also differed for Cx1' and Cx2'. In devising a control strategy for varying Vx1' and Vx2', consideration needs to be given to the effect of the differences in the rise times and fall times. Consideration also needs to be given to the fact that Vx' may be increased by increasing only Vx1', decreasing only Vx2' or a combination of increasing Vx1' and decreasing Vx2'.

In one RLG path length control application of Applicant's invention, a center tapped piezoelectric transducer may be utilized. In this application support member 18 shown in FIG. 1a forms part of an assembly for providing translational movement of a mirror to maintain laser intensity within the RLG. An arrangement of a center tapped piezoelectric mirror transducer is shown in U.S. Pat. No. 4,915,492 dated Apr. 10, 1990 which is hereby incorporated by reference.

In accordance with the foregoing description, Applicant has developed a piezoelectric transducer drive which may be incorporated into the design of path length control circuits for RLGS. In addition, Applicant's invention may be used in many applications unrelated to RLGs.

Although a specific embodiment of the Applicant's invention is shown and described for illustrative purposes, a number of variations and modifications will be apparent to those of ordinary skill in the relevant arts. It is not intended that coverage be limited to the disclosed embodiment, but only by the terms of the following claims.

I claim:

1. Apparatus for applying a drive voltage to a piezoelectric transducer in a control system, said transducer having a first terminal and a second terminal, with said transducer drive voltage being the difference in a first voltage applied to said first terminal and a second voltage applied to said second terminal, comprising:

first pulse rate means for applying a first charge to said first terminal at a first rate;

means for removing said first charge from said first terminal at a second rate, with said transducer drive voltage increasing when an average of said first rate exceeds an average of said second rate;

second pulse rate means for applying a second charge to said second terminal at a third rate;

means for removing said second charge from said second terminal at a fourth rate, with said transducer drive voltage decreasing when an average of said third rate exceeds an average of said fourth rate.

2. Apparatus of claim 1 wherein said means for applying a first charge to said first terminal comprises:

means for converting a first digital word related to said first voltage to a first pulse rate signal at a first voltage level;

first transformer means for converting said first pulse rate signal at a first voltage level to a first pulse rate signal at a second voltage level; and unidirectional conducting means connecting said first pulse rate signal at a second voltage level to said first terminal of said transducer.

3. Apparatus of claim 1 wherein said means for converting said first digital word to a first pulse rate signal comprises pulse rate generator means.

4. Apparatus of claim 1 wherein said means for removing said first charge from said first terminal at a second rate comprises conductive means connected between said first terminal of said transducer and ground.

5. Apparatus of claim 4 wherein said control system is a path length control system for maintaining laser intensity within a ring laser gyroscope with said transducer providing translational movement of a mirror means.

6. Apparatus of claim 2 wherein said unidirectional conducting means comprises a diode.

7. Apparatus of claim 3 wherein said conductive means comprises a resistor.

8. Apparatus for applying a drive voltage to a piezoelectric transducer in a control system, said transducer having a first terminal and a second terminal, with said transducer drive voltage being the difference in a first voltage applied to said first terminal and a second voltage applied to said second terminal, comprising:

means for converting a first digital word related to said desired first voltage into a first pulse rate;

means for converting a second digital word related to said desired second voltage into a second pulse rate;

first transformer means for translating the voltage of said first pulse rate from a first level to a second level;

means for applying said first pulse rate at said second level to said first terminal of said transducer;

means for bleeding a first current from said first terminal of said transducer;

second transformer means for translating the voltage of said second pulse rate from a first level to a second level;

means for applying said second pulse rate at said second level to said second terminal of said transducer; and means for bleeding current from said second terminal of said transducer.

9. Apparatus of claim 8 wherein said means for converting comprises programmable rate pulse generators.

10. Apparatus of claim 9 wherein said first transformer means has a primary winding and a secondary winding and said means for applying said first pulse rate at said second voltage level to said first terminal of said transducer comprises diode means connected between a first terminal of said secondary winding and said first terminal of said transducer.

11. Apparatus of claim 10 wherein said second transformer means has a primary winding and a secondary winding and said means for applying said second pulse rate at said second voltage level to said second terminal of said transducer comprises diode means connected between a first terminal of said secondary winding and said second terminal of said transducer.

12. Apparatus of claim 11 wherein said transducer is a center tapped transducer with said center tap, a second terminal of said secondary winding of said first transformer means, and a second terminal of said secondary winding of said second transformer means are connected to ground.

13. Apparatus of claim 8 wherein said control system is a path length control system for maintaining laser intensity within a ring laser gyroscope with said transducer providing translational movement of a mirror means.

14. Apparatus of claim 13 wherein said means for converting comprises programmable rate pulse generators.

15. Apparatus of claim 14 wherein said first transformer means has a primary winding and a secondary winding and said means for applying said first pulse rate at said second voltage level to said first terminal of said transducer comprises diode means connected between a first terminal of said secondary winding and said first terminal of said transducer.

16. Apparatus of claim 15 wherein said second transformer means has a primary winding and a secondary winding and said means for applying said second pulse rate at said second voltage level to said second terminal of said transducer comprises diode means connected between a first terminal of said secondary winding and said second terminal of said transducer.

17. Apparatus of claim 11 wherein said transducer has a third electrically conductive central support member which is mechanically connected to a drive assembly for providing translational movement of a mirror, said translational movement for maintaining laser intensity in a ring laser gyroscope.

18. Apparatus of claim 17 wherein said central support member has a third electrical terminal and said third electrical terminal is connected at the interconnection of said first transformer secondary winding and said second transformer secondary winding.

\* \* \* \* \*